US009806083B2

(12) United States Patent
Mojumder et al.

(10) Patent No.: US 9,806,083 B2
(45) Date of Patent: Oct. 31, 2017

(54) STATIC RANDOM ACCESS MEMORY (SRAM) BIT CELLS WITH WORDLINES ON SEPARATE METAL LAYERS FOR INCREASED PERFORMANCE, AND RELATED METHODS

(71) Applicant: QUALCOMM Incorporated, San Diego, CA (US)

(72) Inventors: Niladri Narayan Mojumder, San Diego, CA (US); Stanley Seungchul Song, San Diego, CA (US); Zhongze Wang, San Diego, CA (US); Kern Rim, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 81 days.

(21) Appl. No.: 14/559,205

(22) Filed: Dec. 3, 2014

(65) Prior Publication Data
US 2016/0163713 A1 Jun. 9, 2016

(51) Int. Cl.
H01L 27/11 (2006.01)
H01L 23/528 (2006.01)
G11C 5/06 (2006.01)
G11C 8/14 (2006.01)
G11C 11/412 (2006.01)
(Continued)

(52) U.S. Cl.
CPC .............. H01L 27/11 (2013.01); G11C 5/063 (2013.01); G11C 8/14 (2013.01); G11C 8/16 (2013.01); G11C 11/412 (2013.01); G11C 11/418 (2013.01); H01L 21/768 (2013.01); H01L 23/528 (2013.01); H01L 27/0207 (2013.01);
(Continued)

(58) Field of Classification Search
None
See application file for complete search history.

(56) References Cited

U.S. PATENT DOCUMENTS 6,262,932 B1 7/2001 Nguyen
6,347,062 B2 2/2002 Nii et al.
(Continued)

OTHER PUBLICATIONS

International Search Report and Written Opinion for PCT/US2015/060912, dated Feb. 23, 2016, 11 pages.
(Continued)

Primary Examiner — Hoang-Quan Ho
(74) Attorney, Agent, or Firm — W&T/Qualcomm

(57) ABSTRACT

Static random access memory (SRAM) bit cells with wordlines on separate metal layers for increased performance are disclosed. In one aspect, an SRAM bit cell is disclosed employing a write wordline in a second metal layer, a first read wordline in a third metal layer, and a second read wordline in a fourth metal layer. Employing wordlines in separate metal layers allows wordlines to have increased widths, which decrease wordline resistance, decrease access time, and increase performance of the SRAM bit cell. To employ wordlines in separate metal layers, multiple tracks in a first metal layer are employed. To couple read wordlines to the tracks to communicate with SRAM bit cell transistors, landing pads are disposed on corresponding tracks disposed in the first metal layer. Landing pads corresponding to the write wordline are placed on corresponding tracks disposed in the first metal layer.

28 Claims, 10 Drawing Sheets

(51) Int. Cl.
*H01L 21/768* (2006.01)
*G11C 8/16* (2006.01)
*G11C 11/418* (2006.01)
*H01L 27/02* (2006.01)

(52) U.S. Cl.
CPC .. *H01L 27/1104* (2013.01); *H01L 2924/0002* (2013.01)

(56) References Cited

U.S. PATENT DOCUMENTS

| | | | |
|---|---|---|---|
| 6,469,328 | B2 | 10/2002 | Yanai et al. |
| 7,038,926 | B2 | 5/2006 | Jeong et al. |
| 7,525,868 | B2 | 4/2009 | Liaw |
| 8,710,592 | B2 | 4/2014 | Lim et al. |
| 9,196,582 | B2 * | 11/2015 | Hsu .................... H01L 23/5226 |
| 2002/0071324 | A1 | 6/2002 | Kitsukawa et al. |
| 2004/0156228 | A1 | 8/2004 | Becker |
| 2005/0047254 | A1 | 3/2005 | Venkatraman et al. |
| 2005/0083765 | A1 * | 4/2005 | Jeong ....................... G11C 8/16 365/230.05 |
| 2005/0124095 | A1 | 6/2005 | Liaw |
| 2006/0118958 | A1 * | 6/2006 | Yang ....................... H01L 27/11 257/758 |
| 2011/0317485 | A1 * | 12/2011 | Liaw ....................... H01L 27/11 365/182 |
| 2013/0154027 | A1 | 6/2013 | Liaw |
| 2014/0273474 | A1 * | 9/2014 | Woo .................... H01L 27/0207 438/703 |
| 2015/0145139 | A1 * | 5/2015 | Hsu ..................... H01L 23/5226 257/774 |
| 2015/0200095 | A1 * | 7/2015 | Huang ................ H01L 21/0338 257/390 |
| 2015/0357279 | A1 * | 12/2015 | Fujiwara ............. G06F 17/5077 257/499 |
| 2016/0163714 | A1 | 6/2016 | Mojumder et al. |

OTHER PUBLICATIONS

Gopi, Srikanth, "Design of 32-Bit 32-Word 10-Read/Write Port Register File," Thesis in partial fulfillment of the requirements for the Degree of Master of Science, Oklahoma State University School of Electrical and Computer Engineering, May 2006, 88 pages.
International Preliminary Report on Patentability for PCT/US2015/080912, dated Jun. 15, 2017, 8 pages.

\* cited by examiner

STATIC RANDOM ACCESS MEMORY (SRAM) BIT CELLS WITH WORDLINES ON SEPARATE METAL LAYERS FOR INCREASED PERFORMANCE, AND RELATED METHODS

BACKGROUND

I. Field of the Disclosure

The technology of the disclosure relates generally to static random access memory (SRAM) bit cells, and particularly to the physical design of SRAM bit cells.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in rows and columns in an SRAM data array. For any given row in an SRAM data array, each column of the SRAM data array includes an SRAM bit cell in which a single data value or bit is stored. Access to a desired SRAM bit cell row is controlled by wordlines corresponding to read and write operations. Read wordlines provide access for reading a bit stored in an SRAM bit cell via corresponding read ports. Further, write wordlines provide access for writing a bit to an SRAM bit cell via corresponding write ports.

In this regard, an SRAM bit cell may be designed with multiple ports for reading and writing a bit associated with the SRAM bit cell. As a non-limiting example, FIG. 1 illustrates a circuit diagram of a commonly used three-port SRAM bit cell 100 that includes a first read wordline 102, a second read wordline 104, and a write wordline 106. In this manner, the three-port SRAM bit cell 100 is configured to be read via a first read port 108 and a second read port 110, and written to via a write port 112. Further, the three-port SRAM bit cell 100 is configured to store a single bit within two (2) inverters 114, 116, wherein the inverters 114, 116 are cross-coupled to retain an electrical charge representing the data value of the bit.

With continuing reference to FIG. 1, to read the three-port SRAM bit cell 100 via the first read port 108, a first read bitline 118 is pre-charged to a logical '1' value, and the first read wordline 102 is configured to activate a first read access transistor 120. In this manner, if the stored bit has a logical '1' value, the inverters 114, 116 are configured to provide a logical '0' value to a first read access transistor 122. The logical '0' value does not activate the first read access transistor 122, thus preserving the logical '1' value on the first read bitline 118. Conversely, if the stored bit has a logical '0' value, the inverters 114, 116 are configured to provide a logical '1' value to the first read access transistor 122. The logical '1' value activates the first read access transistor 122, thus providing a logical '0' value to the first read bitline 118 via a ground voltage source 124. The second read wordline 104, a second read bitline 126, second read access transistors 128, 130, and the ground voltage source 124 are configured in a similar manner to perform reads via the second read port 110.

With continuing reference to FIG. 1, to write a bit to the three-port SRAM bit cell 100 via the write port 112, the write wordline 106 is configured to activate two (2) write access transistors 132, 134. A value to be written to the three-port SRAM bit cell 100 is provided by a write bitline 136, while a complementary value is provided by a complementary write bitline 138. Thus, to write a logical '1' value, the write wordline 106 activates the write access transistors 132, 134, and the write bitline 136 provides a logical '1' value while the complementary write bitline 138 provides a logical '0' value. Such a configuration of logical values causes the inverters 114, 116 to store a logical '1' value. Conversely, to write a logical '0' value, the write wordline 106 activates the write access transistors 132, 134, and the write bitline 136 and the complementary write bitline 138 provide a logical '0' value and a logical '1' value, respectively. In this manner, the three-port SRAM bit cell 100 may be accessed for independent read operations using the first read wordline 102 and the second read wordline 104, and accessed for a write operation using the write wordline 106.

While the circuit design of the three-port SRAM bit cell 100 in FIG. 1 provides the functionality described above, the physical design may be a source of performance limitations. Notably, as the gate length of the first read access transistors 120, 122, the second read access transistors 128, 130, the write access transistors 132, 134, and transistors associated with the inverters 114, 116 continues to decrease to fourteen (14) nanometers (nm) and below, design rules associated with certain fabrication techniques, such as self-aligned-double-patterning (SADP), require that particular metal levels have a unidirectional orientation. However, designing the three-port SRAM bit cell 100 to conform to such design rules may increase the complexity of the corresponding physical design. An increase in the complexity of the physical design commonly results in reducing the width of the first and second read wordlines 102, 104 and the width of the write wordline 106. As the width of the first and second read wordlines 102, 104 and the write wordline 106 decreases, the resistance of each wordline 102, 104, 106 increases. An increase in the resistance of the first and second read wordlines 102, 104 and the write wordline 106 increases the access time of each wordline 102, 104, 106, thus reducing the performance of the three-port SRAM bit cell 100. Therefore, it would be advantageous to design a three-port SRAM bit cell with a physical design that conforms to design rules while having wordlines with decreased resistance, thus increasing the performance of the three-port SRAM bit cell.

SUMMARY OF THE DISCLOSURE

Aspects disclosed in the detailed description include static random access memory (SRAM) bit cells with wordlines on separate metal layers for increased performance. Related methods are also disclosed. In one aspect, an SRAM bit cell is disclosed that employs a write wordline in a second metal layer, a first read wordline in a third metal layer different from the second metal layer, and a second read wordline in a fourth metal layer different from the second and third metal layers. By employing the write wordline and the first and second read wordlines in separate metal layers, the write wordline and the first and second read wordlines may each be designed to conform to design rules while having an increased width. Such an increased width corresponds to a decreased resistance of each corresponding wordline, which decreases each corresponding access time, thus increasing performance of the SRAM bit cell.

To employ the write wordline and the first and second read wordlines in separate metal layers, the SRAM bit cell also employs multiple tracks in a first metal layer. To couple the first read wordline to the tracks so as to couple to transistors in the SRAM bit cell, landing pads corresponding to the first read wordline are disposed on corresponding tracks. Similarly, to couple the second read wordline to the tracks, landing pads corresponding to the second read wordline are disposed on corresponding tracks. Further, landing pads corresponding to the write wordline are also placed on corresponding tracks.

In this regard in one aspect, an SRAM bit cell is disclosed. The SRAM bit cell comprises a plurality of tracks employed in a first metal layer. The SRAM bit cell further comprises a write wordline employed in a second metal layer. The SRAM bit cell further comprises a first read wordline employed in a third metal layer. The SRAM bit cell further comprises a second read wordline employed in a fourth metal layer. The SRAM bit cell further comprises each first read wordline landing pad of a plurality of first read wordline landing pads disposed on a corresponding track of the plurality of tracks. The SRAM bit cell further comprises each second read wordline landing pad of a plurality of second read wordline landing pads disposed on a corresponding track of the plurality of tracks. The SRAM bit cell further comprises each write wordline landing pad of a plurality of write wordline landing pads disposed on a corresponding track of the plurality of tracks.

In another aspect, an SRAM bit cell is disclosed. The SRAM bit cell comprises a means for disposing a plurality of tracks employed in a first metal layer. The SRAM bit cell further comprises a means for disposing a write wordline employed in a second metal layer. The SRAM bit cell further comprises a means for disposing a first read wordline employed in a third metal layer. The SRAM bit cell further comprises a means for disposing a second read wordline employed in a fourth metal layer. The SRAM bit cell further comprises a means for disposing each first read wordline landing pad of a plurality of first read wordline landing pads on a corresponding track of the plurality of tracks. The SRAM bit cell further comprises a means for disposing each second read wordline landing pad of a plurality of second read wordline landing pads on a corresponding track of the plurality of tracks. The SRAM bit cell further comprises a means for disposing each write wordline landing pad of a plurality of write wordline landing pads on a corresponding track of the plurality of tracks.

In another aspect, a method of fabricating an SRAM bit cell is disclosed. The method comprises disposing a plurality of tracks employed in a first metal layer. The method further comprises disposing a write wordline employed in a second metal layer. The method further comprises disposing a first read wordline employed in a third metal layer. The method further comprises disposing a second read wordline employed in a fourth metal layer. The method further comprises disposing each first read wordline landing pad of a plurality of first read wordline landing pads on a corresponding track of the plurality of tracks. The method further comprises disposing each second read wordline landing pad of a plurality of second read wordline landing pads on a corresponding track of the plurality of tracks. The method further comprises disposing each write wordline landing pad of a plurality of write wordline landing pads on a corresponding track of the plurality of tracks.

In another aspect, an SRAM is disclosed. The SRAM comprises an SRAM array comprising a plurality of SRAM bit cells. Each SRAM bit cell of the plurality of SRAM bit cells comprises a plurality of tracks employed in a first metal layer. Each SRAM bit cell of the plurality of SRAM bit cells further comprises a write wordline employed in a second metal layer. Each SRAM bit cell of the plurality of SRAM bit cells further comprises a first read wordline employed in a third metal layer. Each SRAM bit cell of the plurality of SRAM bit cells further comprises a second read wordline employed in a fourth metal layer. Each SRAM bit cell of the plurality of SRAM bit cells further comprises each first read wordline landing pad of a plurality of first read wordline landing pads disposed on a corresponding track of the plurality of tracks. Each SRAM bit cell of the plurality of SRAM bit cells further comprises each second read wordline landing pad of a plurality of second read wordline landing pads disposed on a corresponding track of the plurality of tracks. Each SRAM bit cell of the plurality of SRAM bit cells further comprises each write wordline landing pad of a plurality of write wordline landing pads disposed on a corresponding track of the plurality of tracks.

DETAILED DESCRIPTION

Figure 1:
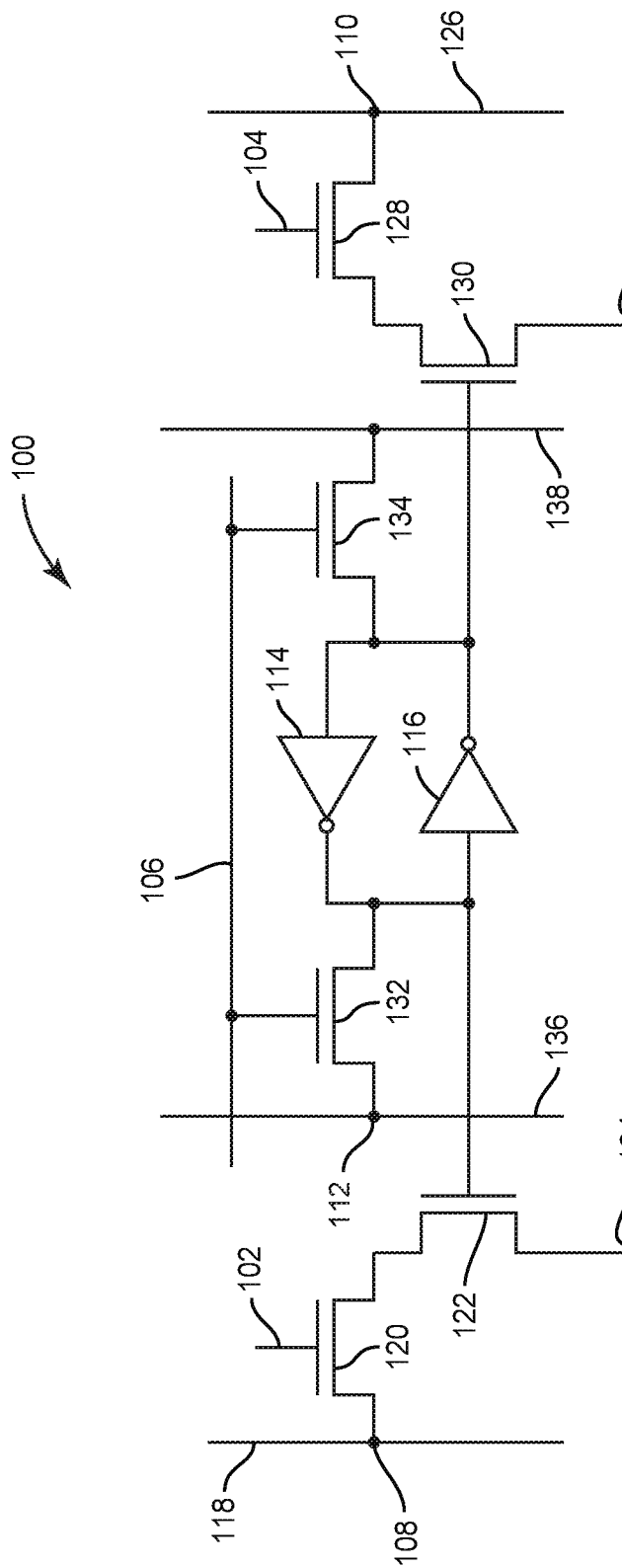
FIG. 1 is a circuit diagram of an exemplary three-port static random access memory (SRAM) bit cell employing a write wordline and two (2) read wordlines.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include static random access memory (SRAM) bit cells with wordlines on separate metal layers for increased performance. Related methods are also disclosed. In one aspect, an SRAM bit cell is disclosed that employs a write wordline in a second metal layer, a first read wordline in a third metal layer different from the second metal layer, and a second read wordline in a fourth metal layer different from the second and third metal layers. By employing the write wordline and the first and second read wordlines in separate metal layers, the write wordline and the first and second read wordlines may each be designed to conform to design rules while having and increased width. Such an increased width corresponds to a decreased resistance of each corresponding wordline, which decreases each corresponding access time, thus increasing performance of the SRAM bit cell.

To employ the write wordline and the first and second read wordlines in separate metal layers, the SRAM bit cell also employs multiple tracks in a first metal layer. To couple the first read wordline to the tracks so as to couple to transistors in the SRAM bit cell, landing pads corresponding to the first read wordline are disposed on corresponding tracks. Similarly, to couple the second read wordline to the tracks, landing pads corresponding to the second read wordline are disposed on corresponding tracks. Further, landing pads corresponding to the write wordline are also placed on corresponding tracks.

Figure 2:
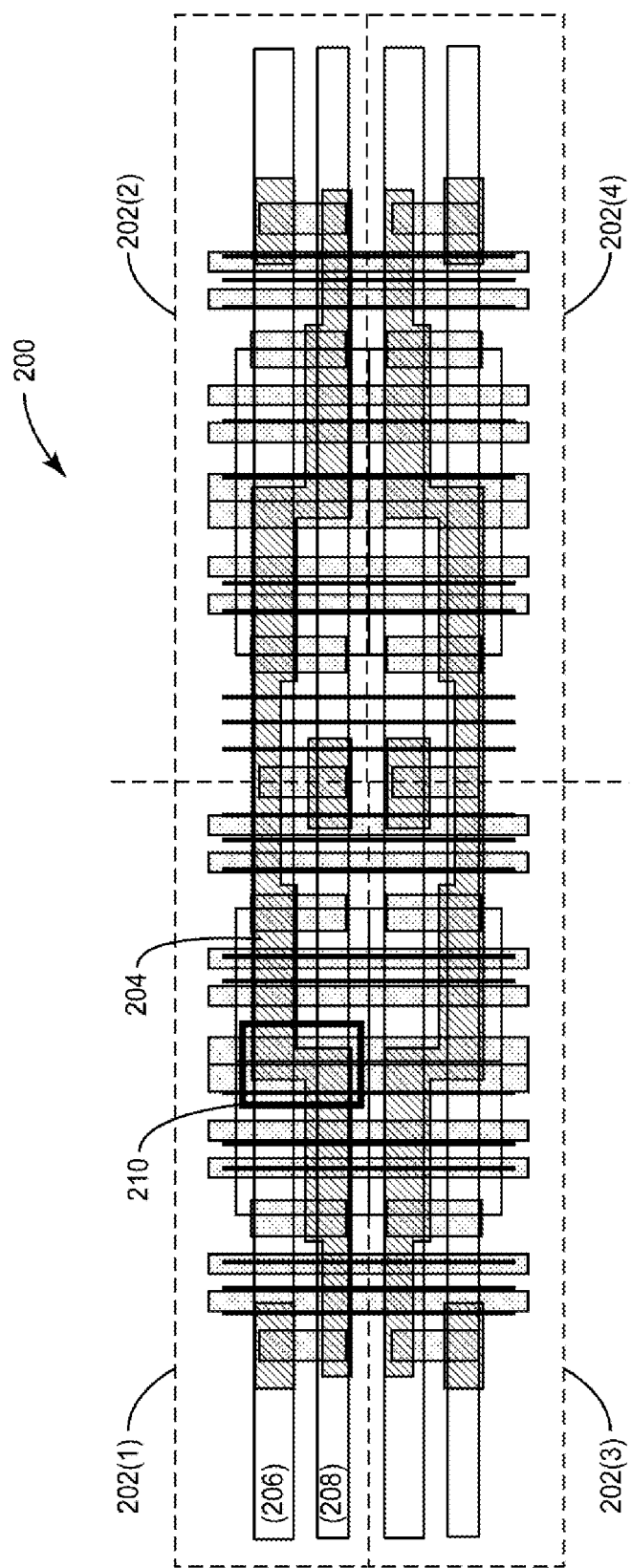
FIG. 2 is a physical layout diagram illustrating a first metal layer and a second metal layer of an exemplary three-port SRAM bit cell employing a write wordline and two (2) read wordlines, wherein the write wordline is multidirectional.
Figure 3:
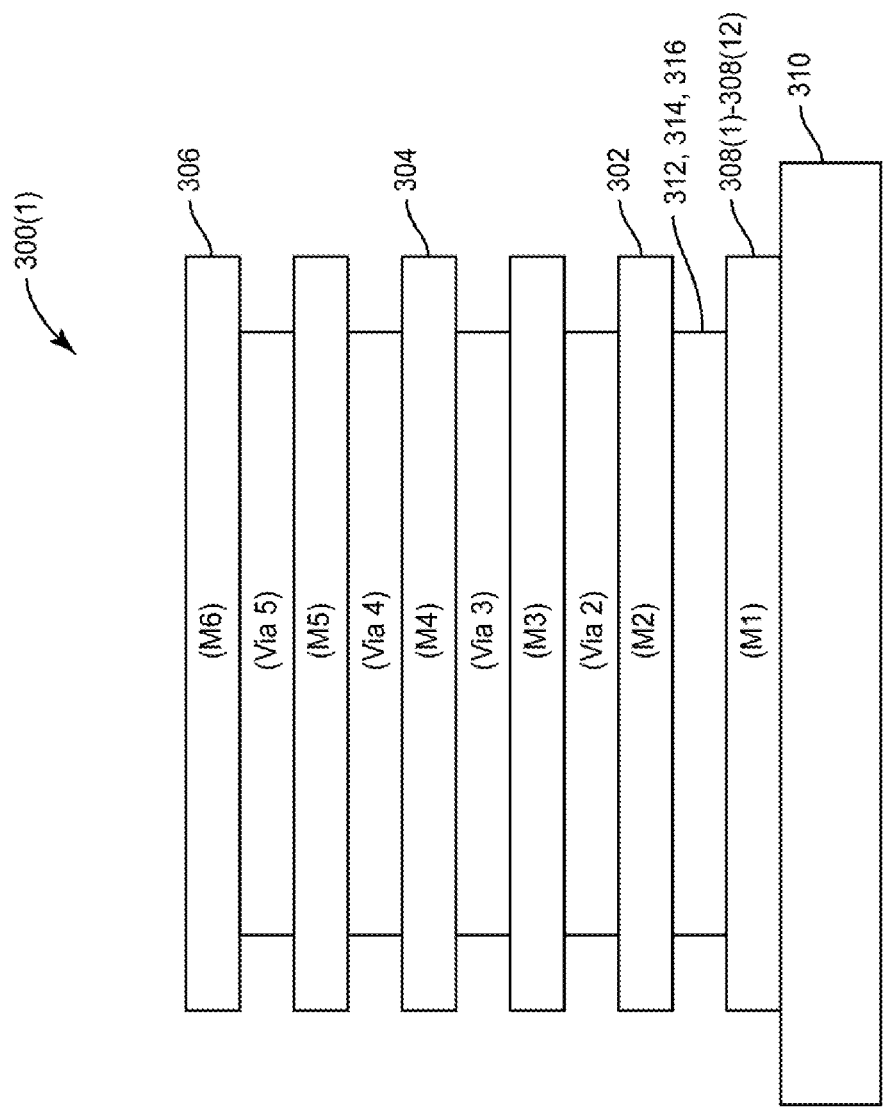
FIG. 3 is a cross-sectional diagram of an exemplary SRAM bit cell employing a write wordline and two (2) read wordlines, wherein tracks are designed to allow unidirectional wordlines on separate metal layers to increase a width of such wordlines, thereby decreasing resistance and increasing performance.

Before discussing specific details of SRAM bit cells employing wordlines on separate metal layers starting at FIG. 3, design rules and design complexity are first described. In this regard, FIG. 2 illustrates an SRAM array 200 that includes three-port SRAM bit cells 202(1)-202(4). The three-port SRAM bit cell 202(1) is now described herein, while the three-port SRAM bit cells 202(2)-202(4) are understood to include similar features as the three-port SRAM bit cell 202(1). The three-port SRAM bit cell 202(1) includes a write wordline 204, a first read wordline 206, and a second read wordline 208. The write wordline 204 is employed in a metal two (2) (M2) layer, while the first read wordline 206 and the second read wordline 208 are employed in a metal three (3) (M3) layer. Notably, in this example, the M3 metal layer is vertically adjacent to the M2 metal layer. As used herein, vertically adjacent refers to a metal layer (MA) disposed above a top side of another metal layer (MB), wherein MA is vertically adjacent to MB if MA is either disposed directly on the top side of MB, or if MA is disposed above the top side of MB with additional metal layers disposed between MA and MB.

With continuing reference to FIG. 2, the write wordline 204 is designed with a multidirectional orientation. Such a multidirectional orientation allows the write wordline 204 to be disposed in both a horizontal and vertical direction, wherein the write wordline 204 changes direction in the three-port SRAM bit cell 202(1) at a corresponding turn 210 (also referred to as a "jog"). However, design rules associated with certain fabrication techniques require that particular metal levels have a unidirectional orientation. As a non-limiting example, such design rules are required when employing the fabrication technique of self-aligned-double-patterning (SADP) with transistors having a gate length of less than or equal to fourteen (14) nanometers (nm). Designing the three-port SRAM bit cell 202(1) to conform to such design rules may increase the complexity of the physical design. As a non-limiting example, conforming to such design rules may increase the design complexity by eliminating the use of turns similar to the turn 210. Eliminating such turns may require the wordlines to be designed with a higher density, thus reducing the width of the write wordline 204 and the first and second read wordlines 206, 208. Such a reduction in width corresponds to an increase in the resistance, and thus an increase in access time, of the write wordline 204 and the first and second read wordlines 206, 208. Therefore, it would be advantageous to design an SRAM bit cell with a physical design that conforms to design rules while having wordlines with decreased resistance as compared to the wordlines 204, 206, 208 of the three-port SRAM bit cell 202(1). Such a decrease in resistance would result in a decrease in the access time of each wordline, thus increasing the performance of the SRAM bit cell.

In this regard, FIG. 3 illustrates a cross-sectional diagram of an exemplary SRAM bit cell 300(1) employing a write wordline 302, a first read wordline 304, and a second read wordline 306. Because the SRAM bit cell 300(1) employs the write wordline 302 and the first and second read wordlines 304, 306, it may be referred to as a three-port SRAM bit cell 300(1). The SRAM bit cell 300(1) includes tracks 308(1)-308(12) designed to allow the write wordline 302 and the first and second read wordlines 304, 306 to be independently employed on separate metal layers in a unidirectional orientation. Designing the write wordline 302 and the first and second read wordlines 304, 306 in this manner may increase the width of the wordlines 302, 304, 306, as compared to employing the write wordline 302 and the first and second read wordlines 304, 306 in non-separate metal layers, similar to the three-port SRAM bit cell 202(1) in FIG. 2. As a non-limiting example, disposing the write wordline 302 and the first and second read wordlines 304, 306 on separate metal layers may allow the wordlines 302, 304, 306 to be designed with a lower density, thus increasing the width of the write wordline 302 and the first and second read wordlines 304, 306. Such increased widths correspond to a decreased resistance associated with the write wordline 302 and the first and second read wordlines 304, 306. A decreased resistance of the write wordline 302 and the first and second read wordlines 304, 306 corresponds to a reduced access time for each wordline, thus increasing performance of the SRAM bit cell 300(1).

With continuing reference to FIG. 3, in this aspect, the SRAM bit cell 300(1) employs the write wordline 302 in a second metal layer, wherein the second metal layer is a metal two (2) (M2) layer. Further, the first read wordline 304 is employed in a third metal layer different than the second metal layer, wherein the third metal layer is a metal four (4) (M4) layer. Additionally, the second read wordline 306 is employed in a fourth metal layer, wherein the fourth metal layer is a metal six (6) (M6) layer. Notably, the M6 metal layer is vertically adjacent to the M4 metal layer, which is vertically adjacent to the M2 metal layer in this aspect. By employing the write wordline 302 and the first and second read wordlines 304, 306 in the M2, M4, and M6 metal layers, respectively, the write wordline 302 and the first and second read wordlines 304, 306 may each be designed to conform to design rules requiring a unidirectional orientation. As previously described, employing the write wordline 302 and the first and second read wordlines 304, 306 may allow for designing each wordline 302, 304, 306 with a lower density, thus increasing the width of each wordline 302, 304, 306. Such an increased width corresponds to a decreased resistance of the write wordline 302 and the first and second read wordlines 304, 306, as compared to corresponding resistances in the three-port SRAM 202(1) in FIG. 2. A decrease in resistance decreases an access time of the write wordline 302 and the first and second read wordlines 304, 306, and thus increases performance of the SRAM bit cell 300(1).

With continuing reference to FIG. 3, to employ the write wordline 302 and the first and second read wordlines 304, 306 independently in the M2, M4, and M6 metal layers, respectively, the SRAM bit cell 300(1) also employs the tracks 308(1)-308(12). The tracks 308(1)-308(12) are employed in a first metal layer, wherein the first metal layer is a metal one (1) (M1) layer disposed on a base layer 310 in this aspect. Further, in this aspect, the tracks 308(1)-308(12) are configured to couple to transistors (not shown) in the base layer 310 by way of corresponding contacts (not shown). As a non-limiting example, the tracks 308(1)-308(12) may be configured to couple to front-end-of-line transistors in the base layer 310 using middle-of-line contacts. In this manner, the base layer 310 employs polysilicon needed to form the transistors of the SRAM bit cell 300(1), such as the front-end-of-line transistors. Notably, the M6, M4, and M2 metal layers are vertically adjacent to the M1 metal layer in this aspect. Additionally, the SRAM bit cell 300(1) employs vias configured to couple each respective metal layer to an adjacent metal layer. In this manner, Via five (Via 5) is configured to couple the M6 metal layer to a metal five (5) (M5) layer, Via four (Via 4) is configured to couple the M5 metal layer to the M4 metal layer, Via three (Via 3) is configured to couple the M4 metal layer to the M3 metal layer, and Via two (Via 2) is configured to couple the M3 metal layer to the M2 metal layer.

With continuing reference to FIG. 3, to couple the first read wordline 304 to the track 308(1) so as to communicate with transistors in the SRAM bit cell 300(1), first read wordline landing pads 312 (also referred to herein as "landing pads 312") corresponding to the first read wordline 304 are disposed on the corresponding tracks 308(1)-308(12). In this aspect, such landing pads 312 and the corresponding tracks 308(1)-308(12) are disposed on a boundary edge of the SRAM bit cell 300(1). Similarly, to couple the second read wordline 306 to the base layer 310, second read wordline landing pads 314 (also referred to herein as "landing pads 314") corresponding to the second read wordline 306 are disposed on the corresponding tracks 308(1)-308(12). In this aspect, such landing pads 314 are also disposed on the boundary edge of the SRAM bit cell 300(1). Further, write wordline landing pads 316 (also referred to herein as "landing pads 316") corresponding to the write wordline 302 are also placed on the corresponding tracks 308(1)-308(12), but such landing pads 316 are disposed within each boundary edge of the SRAM bit cell 300(1) in this aspect. Notably, while this aspect includes the landing pads 312, 314, 316 disposed on or within the boundary edges of the SRAM bit cell 300(1), respectively, other aspects may include the landing pads 312, 314, 316 disposed in alternative locations with respect to the boundary edges of the SRAM bit cell 300(1).

Figure 4:
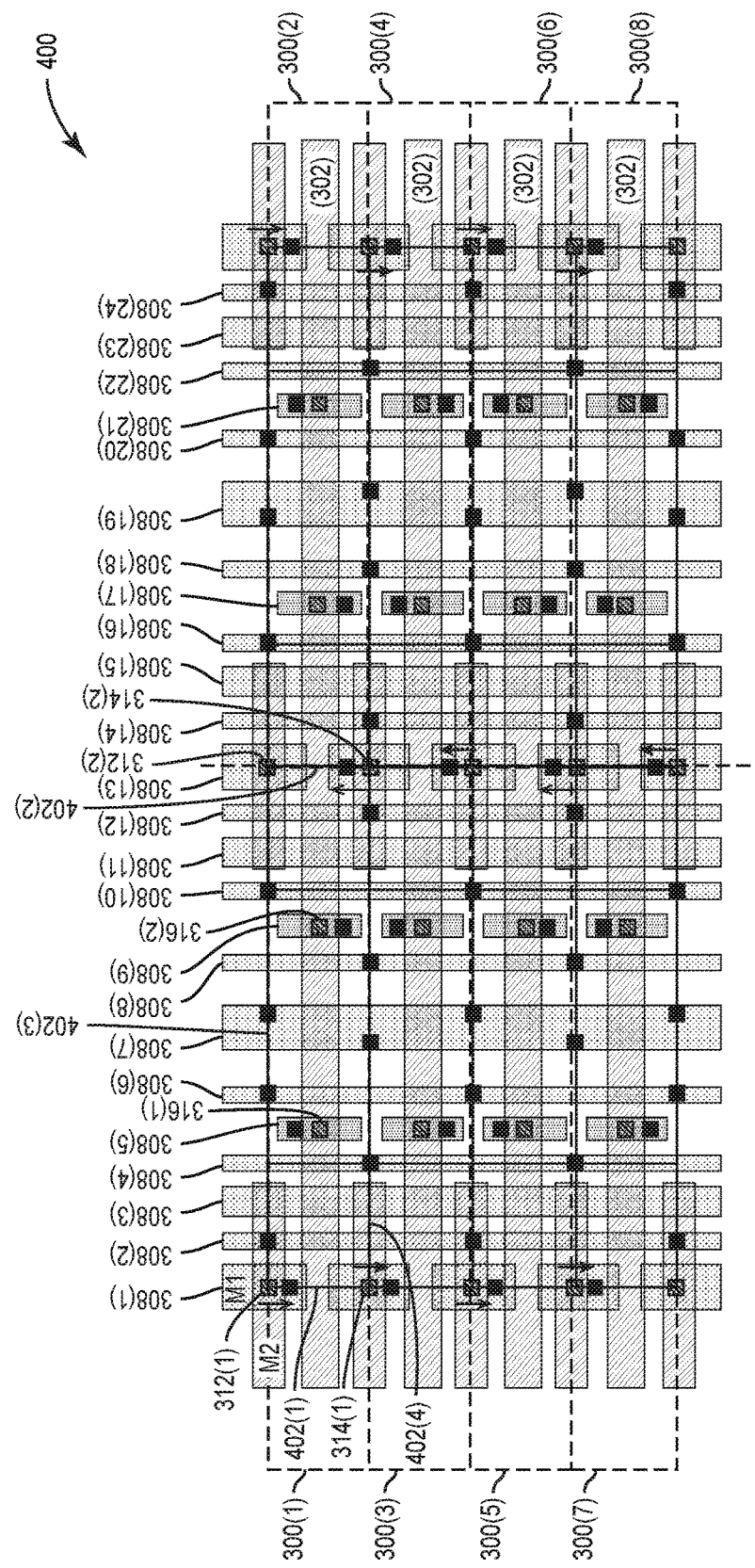
FIG. 4 is a physical layout diagram illustrating a metal one (1) (M1) layer and a metal two (2) (M2) layer of the SRAM bit cell in FIG. 3.

In this regard, FIG. 4 illustrates the M1 metal layer and the M2 metal layer of an SRAM array 400 that includes SRAM bit cells 300(1)-300(8), wherein the SRAM bit cells 300(2)-300(8) are similar to the SRAM bit cell 300(1) in FIG. 3. Notably, although the SRAM bit cells 300(1)-300(8) are demarcated with dashed lines for clarity, respective boundary edges 402 represent the actual edges of the SRAM bit cells 300(1)-300(8). In this manner, boundary edges 402(1)-402(4) represent the actual edges of the SRAM bit cell 300(1). Details of the SRAM bit cell 300(1) are now described herein, while it is understood that the SRAM bit cells 300(2)-300(8) include similar features as the SRAM bit cell 300(1). In this aspect, the SRAM bit cell 300(1) includes twelve (12) tracks 308(1)-308(12) in the M1 metal layer.

Notably, the SRAM bit cell 300(2) includes twelve (12) tracks 308(13)-308(24). The track 308(1) includes the landing pad 312(1) that is configured to couple the track 308(1) to the M2 metal layer. In this aspect, the track 308(1) and the landing pad 312(1) are disposed on a boundary edge 402(1) of the SRAM bit cell 300(1). As described in more detail below, coupling the track 308(1) to the M2 metal layer using the landing pad 312(1) provides a portion of a path that couples the first read wordline 304 to the track 308(1) to communicate with the transistors of the SRAM bit cell 300(1). Further, in this aspect, because the tracks 308(1)-308(12) corresponding to the first read wordline landing pads 312 are disposed on a boundary edge 402(2) of the SRAM bit cell 300(1), the first read wordline 304 of the SRAM bit cell 300(1) shares a landing pad 312(2) disposed on the track 308(13) with the SRAM bit cell 300(2).

With continuing reference to FIG. 4, the track 308(1) also includes the landing pad 314(1) that is configured to couple the track 308(1) to the M2 metal layer. Because the landing pad 314(1) is disposed on the track 308(1), the landing pad 314(1) is disposed on the boundary edge 402(1) of the SRAM bit cell 300(1) similar to the landing pad 312(1) in this aspect. As described in more detail below, coupling the track 308(1) to the M2 metal layer using the landing pad 314(1) provides a portion of a path that couples the second read wordline 306 to the track 308(1) to communicate with the transistors of the SRAM bit cell 300(1). Further, the second read wordline 306 of the SRAM bit cell 300(1) shares a landing pad 314(2) disposed on the track 308(13) with the SRAM bit cell 300(2).

With continuing reference to FIG. 4, the tracks 308(5), 308(9) include the landing pads 316(1), 316(2), respectively. The landing pads 316(1), 316(2) are configured to couple the tracks 308(5), 308(9) to the write wordline 302 in the M2 metal layer, respectively. In this aspect, the tracks 308(5), 308(9) and the landing pads 316(1), 316(2) are disposed within each boundary edge 402(1)-402(4) of the SRAM bit cell 300(1). Coupling the tracks 308(5), 308(9) to the write wordline 302 in the M2 metal layer using the landing pads 316(1), 316(2) provides a path that couples the write wordline 302 to the track 308(1) to communicate with the transistors of the SRAM bit cell 300(1).

With continuing reference to FIG. 4, in addition to the write wordline 302 and the first and second read wordlines 304, 306, the tracks 308(1)-308(12) are configured to support other elements employed by the SRAM bit cell 300(1). In this manner, the tracks 308(2), 308(12) support first and second read bitlines associated with the first and second read wordlines 304, 306. The tracks 308(3), 308(11) are configured to support a global read bitline associated with the first and second read wordlines 304, 306. Further, the track 308(7) is configured to support a high voltage source line (e.g., VDD) for the SRAM bit cell 300(1), while the track 308(4) is configured to support a low voltage source line (e.g., VSS). The tracks 308(6), 308(8) are configured to support write bitlines associated with the write wordline 302. By employing the tracks 308(1)-308(12) and the landing pads 312(1)-312(2), 314(1)-314(2), and 316(1)-316(2) as described herein, the M1 metal layer and the M2 metal layer of the SRAM bit cell 300(1) may be fabricated using the self-aligned-double-patterning (SADP) technique.

Figure 5:
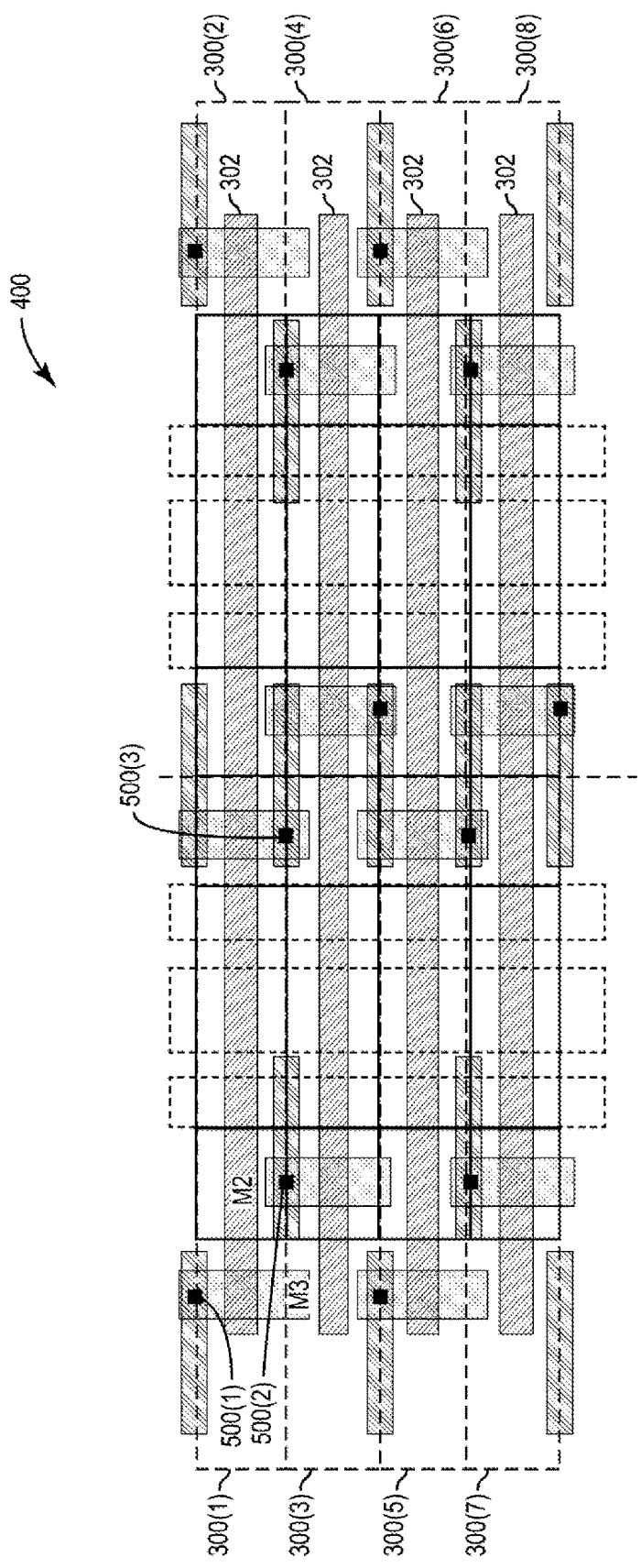
FIG. 5 is a physical layout diagram illustrating the M2 metal layer and a metal three (3) (M3) layer of the SRAM bit cell in FIG. 3.

To complete remaining portions of the paths coupling the first read wordline 304 and the second read wordline 306 to the landing pads 312, 314, respectively, additional metal layers and interconnects are provided in the SRAM bit cell 300(1). In this regard, FIG. 5 illustrates the M2 metal layer and a metal three (3) (M3) layer of the SRAM array 400 in FIG. 4. Notably, in this aspect, the M3 metal layer is vertically adjacent to the M2 metal layer. Further, interconnects 500(1)-500(3) are disposed on the M2 metal layer so as to couple the M2 metal layer to the M3 metal layer. Using the interconnect 500(1) to couple the M2 metal layer to the M3 metal layer provides a portion of the path that couples the first read wordline 304 to the track 308(1) to communicate with the transistors of the SRAM bit cell 300(1). Similarly, using the interconnects 500(2), 500(3) to couple the M2 metal layer to the M3 metal layer provides a portion of the path that couples the second read wordline 306 to the track 308(1) to communicate with the transistors of the SRAM bit cell 300(1).

Figure 6:
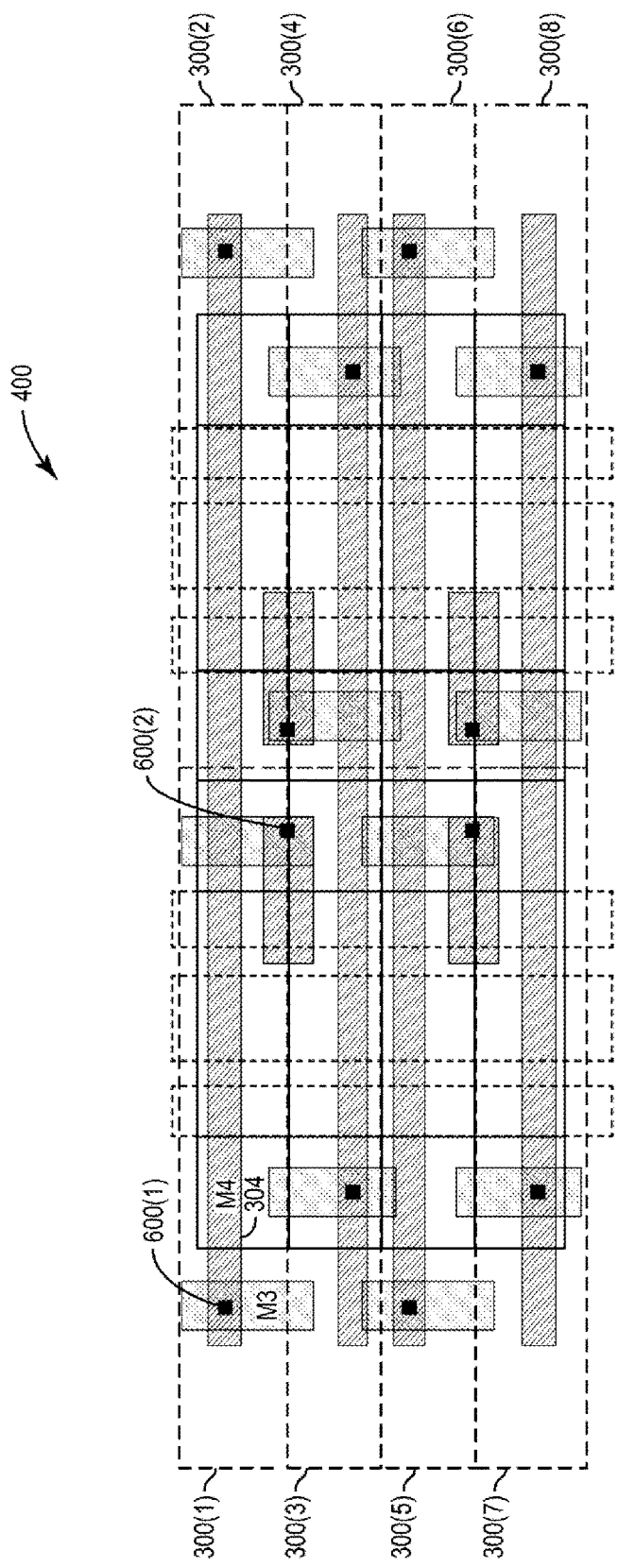
FIG. 6 is a physical layout diagram illustrating the M3 metal layer and a metal four (4) (M4) layer of the SRAM bit cell in FIG. 3.

Additionally, FIG. 6 illustrates the M3 metal layer and the M4 metal layer of the SRAM array 400 in FIG. 4. In this aspect, interconnects 600(1), 600(2) are disposed on the M3 metal layer so as to couple the M3 metal layer to the M4 metal layer, wherein the M4 metal layer is vertically adjacent to the M3 metal layer. Notably, using the interconnect 600(1) to couple the M3 metal layer to the M4 metal layer completes the path that couples the first read wordline 304 to the track 308(1) to communicate with the transistors of the SRAM bit cell 300(1). In other words, because the first read wordline 304 is employed in the M4 metal layer in this aspect, the interconnect 600(1) couples the M3 metal layer and the first read wordline 304. Further, using the interconnect 600(2) to couple the M3 metal layer to the M4 metal layer provides a portion of the path that couples the second read wordline 306 to the track 308(1) to communicate with the transistors of the SRAM bit cell 300(1), as the second read wordline 306 is employed in the M6 metal layer in this aspect.

Figure 7:
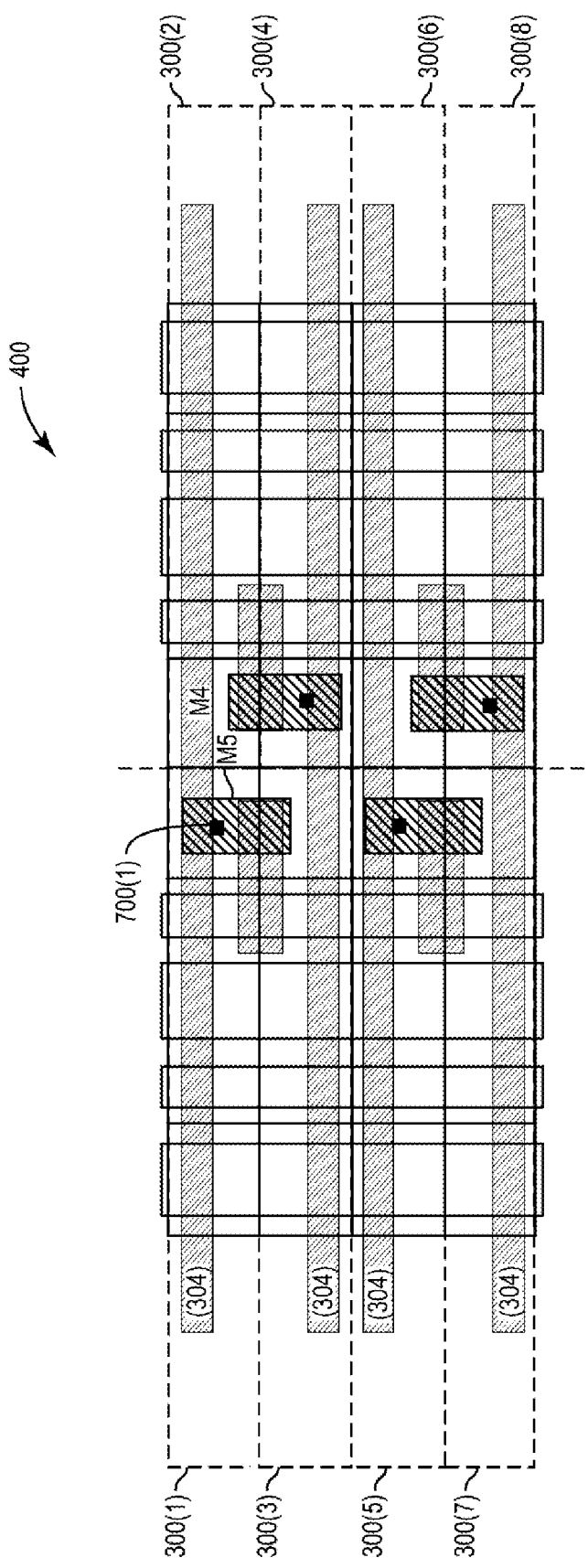
FIG. 7 is a physical layout diagram illustrating the M4 metal layer and a metal five (5) (M5) layer of the SRAM bit cell in FIG. 3.

Additionally, FIG. 7 illustrates the M4 metal layer and a metal five (5) (M5) layer of the SRAM array 400 in FIG. 4, wherein the M5 metal layer is vertically adjacent to the M4 metal layer. In this aspect, an interconnect 700(1) is disposed on the M4 metal layer so as to couple the M4 metal layer to the M5 metal layer. Notably, using the interconnect 700(1) to couple the M4 metal layer to the M5 metal layer provides a portion of the path that couples the second read wordline 306 to the track 308(1) to communicate with the transistors of the SRAM bit cell 300(1).

Figure 8:
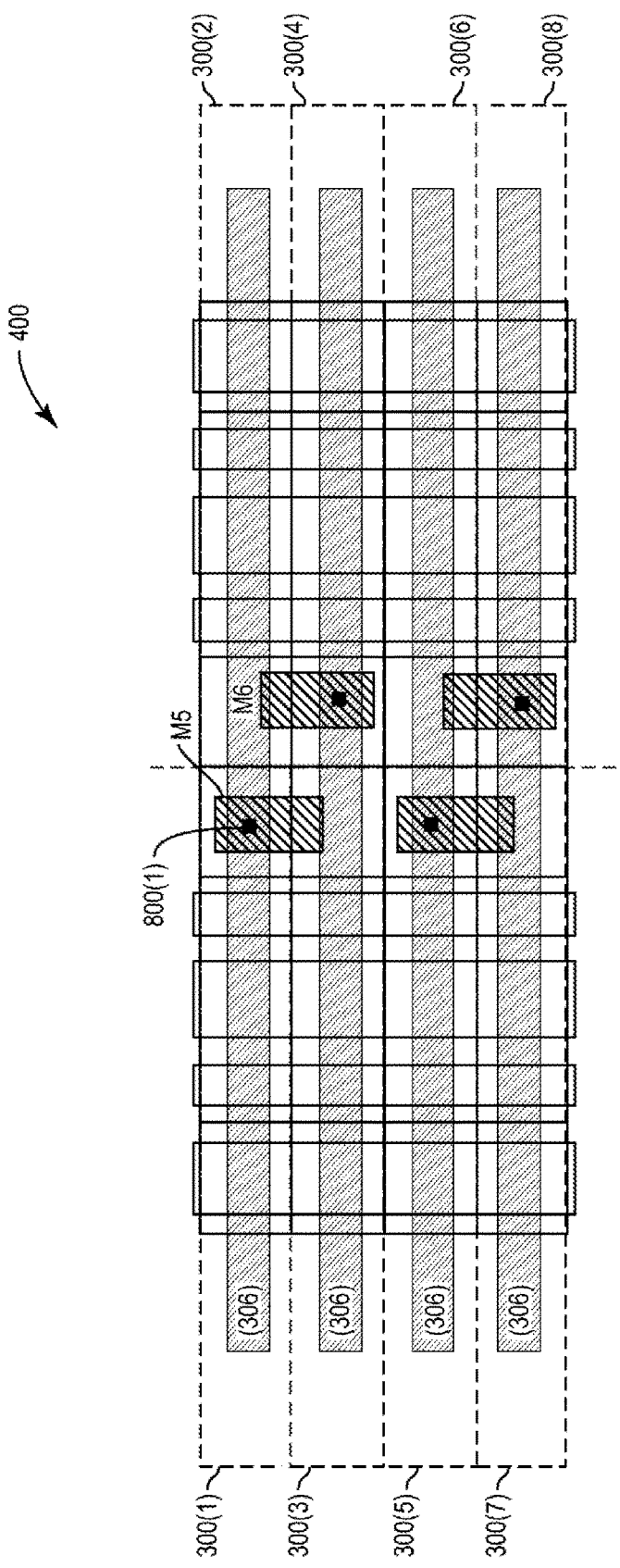
FIG. 8 is a physical layout diagram illustrating the M5 metal layer and a metal six (6) (M6) layer of the SRAM bit cell in FIG. 3.

Additionally, FIG. 8 illustrates the M5 metal layer and the M6 metal layer of the SRAM array 400 in FIG. 4, wherein the M6 metal layer is vertically adjacent to the M5 metal layer. In this aspect, an interconnect 800(1) is disposed on the M5 metal layer so as to couple the M5 metal layer to the M6 metal layer. Notably, using the interconnect 800(1) to couple the M5 metal layer to the M6 metal layer completes the path that couples the second read wordline 306 to the track 308(1) to communicate with the transistors of the SRAM bit cell 300(1). In other words, because the second read wordline 306 is employed in the M6 metal layer in this aspect, the interconnect 800(1) couples the M5 metal layer and the second read wordline 306.

In this regard, FIGS. 4-8 illustrate that the write wordline 302 and the first and second read wordlines 304, 306 in the SRAM bit cell 300(1) are employed in the M2, M4, and M6 metal layers, respectively. Thus, the write wordline 302 and the first and second read wordlines 304, 306 may each be designed to conform to design rules requiring a unidirectional orientation while having an increased width, as compared to a corresponding width of the write wordline 302 and the first and second read wordlines 304, 306 not employed in separate metal layers. An increased width corresponds to a decreased resistance of the write wordline 302 and the first and second read wordlines 304, 306. Such a decreased resistance decreases an access time of the write wordline 302 and the first and second read wordlines 304, 306, and thus increases performance of the SRAM bit cell 300(1).

Figure 9:
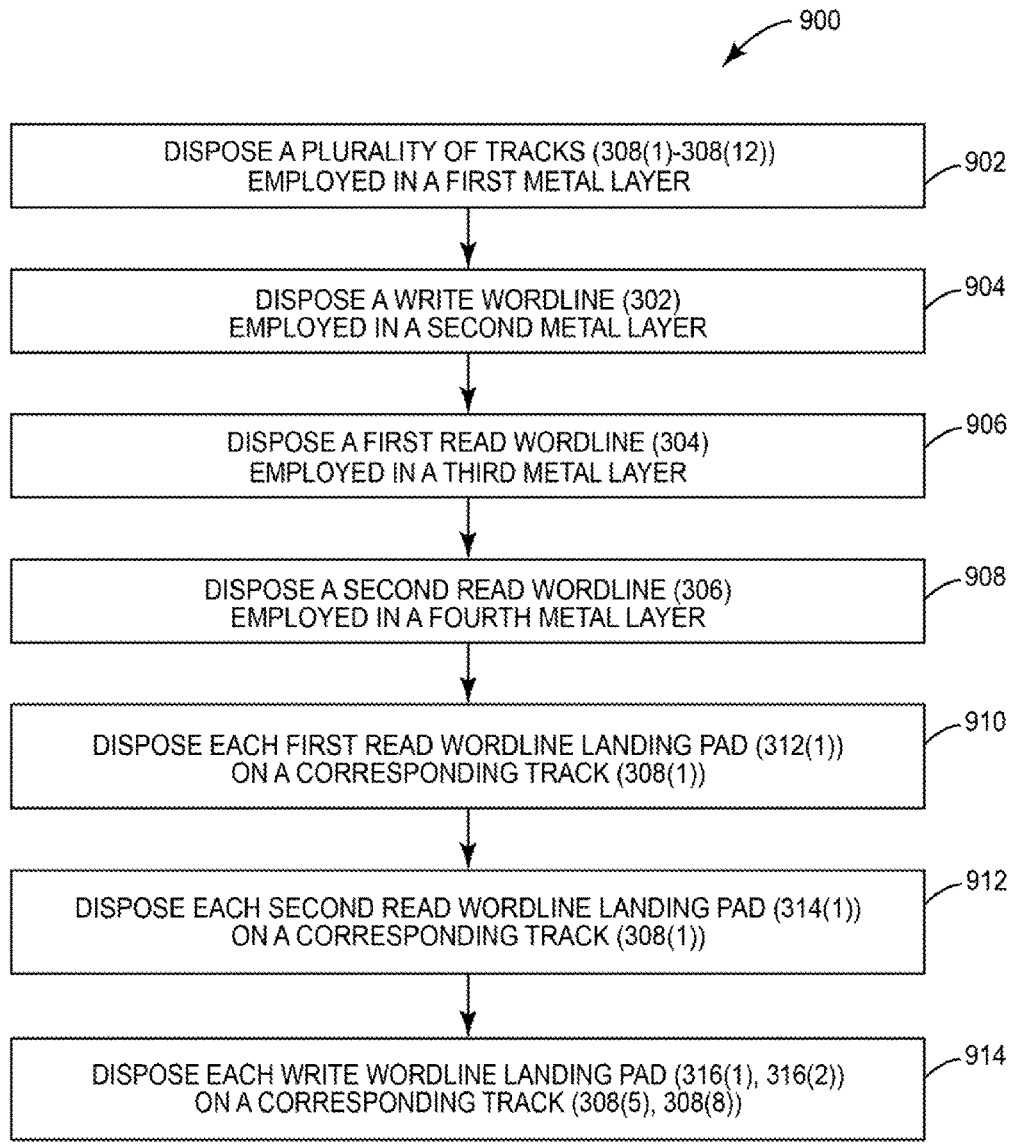
FIG. 9 is a flowchart illustrating an exemplary process for fabricating the SRAM bit cell in FIG. 3, wherein tracks are designed to allow unidirectional read and write wordlines on separate metal layers to increase a width of such wordlines, thereby decreasing resistance and increasing performance.

In this regard, FIG. 9 illustrates an exemplary process 900 employed to fabricate the SRAM bit cell 300(1) in FIG. 3. The process 900 includes disposing the plurality of tracks 308(1)-308(12) employed in a first metal layer (block 902). In this aspect, the tracks 308(1)-308(12) are employed in the M1 metal layer, and disposed on a base layer 310 so that the tracks 308(1)-308(12) are coupled to transistors in the SRAM bit cell 300(1). To employ the write wordline 302, the process 900 includes disposing the write wordline 302 employed in a second metal layer (block 904). The write wordline 302 is employed in the M2 metal layer in this aspect, wherein the M2 metal layer is vertically adjacent to the M1 metal layer. To employ the first read wordline 304, the process 900 includes disposing the first read wordline 304 employed in a third metal layer (block 906). The first read wordline 304 is employed in the M4 metal layer in this aspect, wherein the M4 metal layer is vertically adjacent to the M3 metal layer, which is vertically adjacent to the M2 metal layer. Further, to employ the second read wordline 306, the process 900 includes disposing the second read wordline 306 employed in a fourth metal layer (block 908). In this aspect, the second read wordline 306 is employed in the M6 metal layer, wherein the M6 metal layer is vertically adjacent to the M5 metal layer, which is vertically adjacent to the M4 metal layer.

With continuing reference to FIG. 9, to employ the write wordline 302 and the first and second read wordlines 304, 306 in separate metal layers as described above, the process 900 provides for coupling the write wordline 302 and the first and second read wordlines 304, 306 to the tracks 308(1)-308(12). In this manner, the process 900 includes disposing each first read wordline landing pad 312(1) on a corresponding track 308(1) (block 910). In this aspect, each first read wordline landing pad 312(1) and corresponding track 308(1) is disposed on the boundary edge 402(1) of the SRAM bit cell 300(1). Further, the process 900 includes disposing each second read wordline landing pad 314(1) on a corresponding track 308(1) (block 912). In this aspect, each second read wordline landing pad 314(1) and corresponding track 308(1) is disposed on the boundary edge 402(1) of the SRAM bit cell 300(1). Further, the process 900 includes disposing each write wordline landing pad 316(1), 316(2) on a corresponding track 308(5), 308(8) (block 914). In this aspect, each write wordline landing pad 316(1), 316(2) and corresponding track 308(5), 308(8) is disposed within each boundary edge 402(1)-402(4) of the SRAM bit cell 300(1). In other words, the tracks 308(1)-308(12) and the landing pads 312(1), 314(1), and 316(1), 316(2) are disposed in a way so as to allow the write wordline 302 and the first and second read wordlines 304, 306 to be disposed on separate metal layers in a unidirectional orientation. Thus, the process 900 enables the write wordline 302 and the first and second read wordlines 304, 306 to be designed to conform to design rules requiring a unidirectional orientation while having an increased width, as compared to a corresponding width of the write wordline 302 and the first and second read wordlines 304, 306 not employed in separate metal layers. An increased width corresponds to a decreased resistance of the write wordline 302 and the first and second read wordlines 304, 306. Such a decrease in resistance decreases an access time of the write wordline 302 and the first and second read wordlines 304, 306, and thus increases performance of the SRAM bit cell 300(1).

The SRAM bit cells with wordlines on separate metal layers for increased performance according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 10:
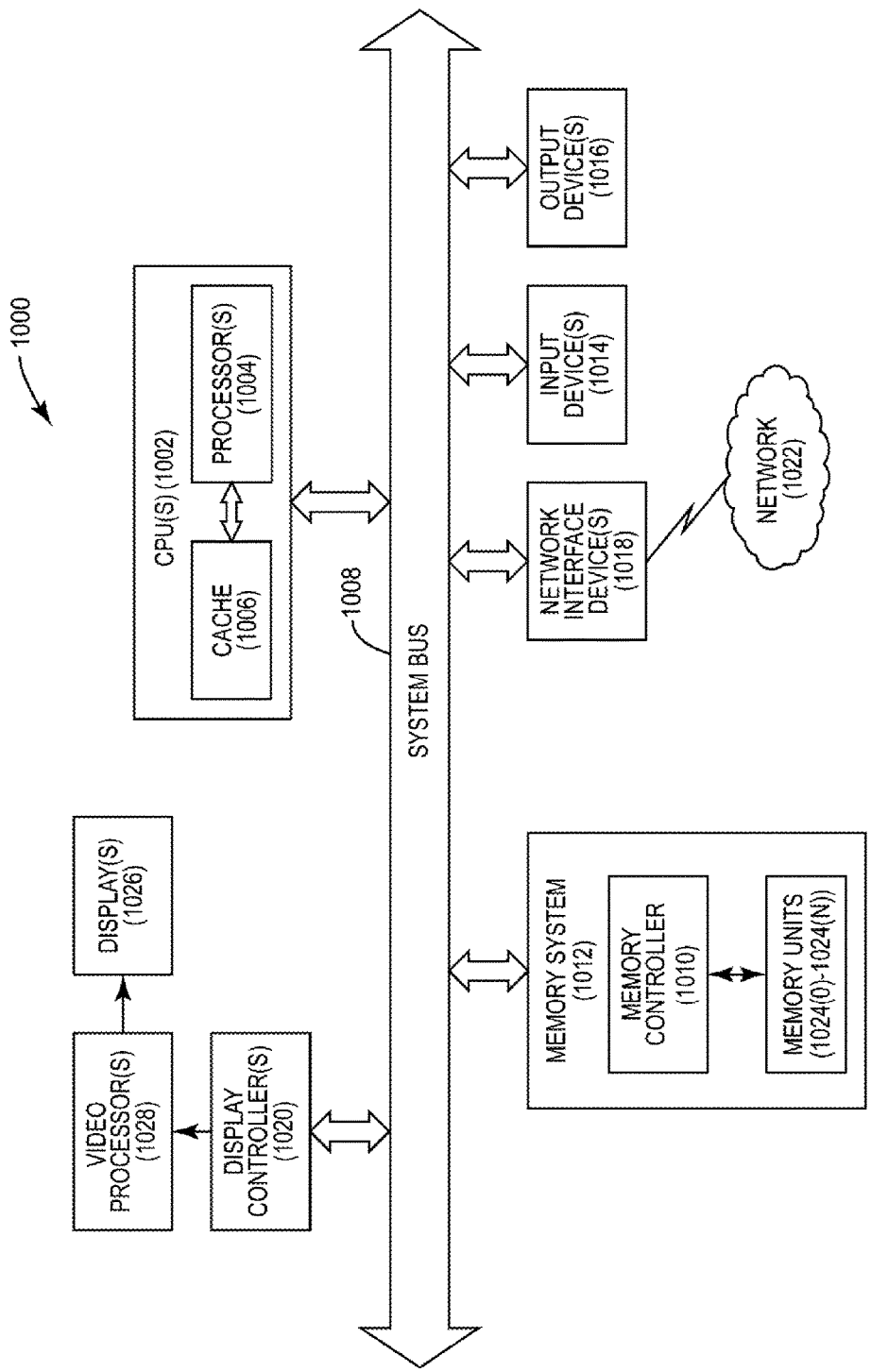
FIG. 10 is a block diagram of an exemplary processor-based system that can include the SRAM bit cell in FIG. 3.

In this regard, FIG. 10 illustrates an example of a processor-based system 1000 that can employ the SRAM bit cell 300(1) illustrated in FIG. 3 in an exemplary SRAM. In this example, the processor-based system 1000 includes one or more central processing units (CPUs) 1002, each including one or more processors 1004. The CPU(s) 1002 may be a master device. The CPU(s) 1002 may have cache memory 1006 coupled to the processor(s) 1004 for rapid access to temporarily stored data. The CPU(s) 1002 is coupled to a system bus 1008 and can intercouple master and slave devices included in the processor-based system 1000. As is well known, the CPU(s) 1002 communicates with these other devices by exchanging address, control, and data information over the system bus 1008. For example, the CPU(s) 1002 can communicate bus transaction requests to a memory controller 1010 as an example of a slave device. Although not illustrated in FIG. 10, multiple system buses 1008 could be provided, wherein each system bus 1008 constitutes a different fabric.

Other master and slave devices can be connected to the system bus 1008. As illustrated in FIG. 10, these devices can include a memory system 1012, one or more input devices 1014, one or more output devices 1016, one or more network interface devices 1018, or one or more display controllers 1020, as examples. The input device(s) 1014 can include any type of input device, including but not limited to input keys, switches, voice processors, etc. The output device(s) 1016 can include any type of output device, including but not limited to audio, video, other visual indicators, etc. The network interface device(s) 1018 can be any device configured to allow exchange of data to and from a network 1022. The network 1022 can be any type of network, including but not limited to a wired or wireless network, a private or public network, a local area network (LAN), a wide local area network (WLAN), and the Internet. The network interface device(s) 1018 can be configured to support any type of communications protocol desired. The memory system 1012 can include one or more memory units 1024(1)-1024(N).

The CPU(s) 1002 may also be configured to access the display controller(s) 1020 over the system bus 1008 to control information sent to one or more displays 1026. The display controller(s) 1020 sends information to the display(s) 1026 to be displayed via one or more video processors 1028, which process the information to be displayed into a format suitable for the display(s) 1026. The display(s) 1026 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A static random access memory (SRAM) bit cell comprising:
   a plurality of tracks employed in a first metal layer;
   a write wordline employed in a second metal layer different from the first metal layer;
   a first read wordline employed in a third metal layer different from the first metal layer and the second metal layer;
   a second read wordline employed in a fourth metal layer different from the first metal layer, the second metal layer, and the third metal layer;
   each first read wordline landing pad of a plurality of first read wordline landing pads disposed on a corresponding track of the plurality of tracks, wherein:
     each first read wordline landing pad is physically and directly coupled to the corresponding track; and
     each first read wordline landing pad electrically couples the first read wordline and the corresponding track;
   each second read wordline landing pad of a plurality of second read wordline landing pads disposed on a corresponding track of the plurality of tracks, wherein:
     each second read wordline landing pad is physically and directly coupled to the corresponding track; and
     each second read wordline landing pad electrically couples the second read wordline and the corresponding track; and
   each write wordline landing pad of a plurality of write wordline landing pads disposed on a corresponding track of the plurality of tracks, wherein:
     each write wordline landing pad is physically and directly coupled to the corresponding track; and
     each write wordline landing pad electrically couples the write wordline and the corresponding track.

2. The SRAM bit cell of claim 1, wherein:
   each first read wordline landing pad and corresponding track is disposed on a boundary edge of the SRAM bit cell;
   each second read wordline landing pad and corresponding track is disposed on the boundary edge of the SRAM bit cell; and
   each write wordline landing pad and corresponding track is disposed within each boundary edge of the SRAM bit cell.

3. The SRAM bit cell of claim 1, wherein:
   the plurality of tracks comprises twelve (12) tracks; and
   the first metal layer comprises a metal one (1) (M1) layer.

4. The SRAM bit cell of claim 1, wherein the second metal layer comprises a metal two (2) (M2) layer.

5. The SRAM bit cell of claim 1, wherein the third metal layer comprises a metal four (4) (M4) layer.

6. The SRAM bit cell of claim 1, wherein the fourth metal layer comprises a metal six (6) (M6) layer.

7. The SRAM bit cell of claim 1, wherein the plurality of tracks and the write wordline are disposed using self-aligned-double-patterning (SADP).

8. The SRAM bit cell of claim 1, wherein the write wordline comprises a unidirectional write wordline.

9. The SRAM bit cell of claim 1, wherein the first read wordline comprises a unidirectional first read wordline.

10. The SRAM bit cell of claim 1, wherein the second read wordline comprises a unidirectional second read wordline.

11. The SRAM bit cell of claim 1, wherein one (1) track of the plurality of tracks comprises a high voltage source line.

12. The SRAM bit cell of claim 1 integrated into an integrated circuit (IC).

13. The SRAM bit cell of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

14. A static random access memory (SRAM) bit cell comprising:
   a means for disposing a plurality of tracks employed in a first metal layer;
   a means for disposing a write wordline employed in a second metal layer different from the first metal layer;
   a means for disposing a first read wordline employed in a third metal layer different from the first metal layer and the second metal layer;
   a means for disposing a second read wordline employed in a fourth metal layer different from the first metal layer, the second metal layer, and the third metal layer;
   a means for disposing each first read wordline landing pad of a plurality of first read wordline landing pads on a corresponding track of the plurality of tracks, wherein:
     each first read wordline landing pad is physically and directly coupled to the corresponding track; and
     each first read wordline landing pad electrically couples the first read wordline and the corresponding track;
   a means for disposing each second read wordline landing pad of a plurality of second read wordline landing pads on a corresponding track of the plurality of tracks, wherein:
     each second read wordline landing pad is physically and directly coupled to the corresponding track; and
     each second read wordline landing pad electrically couples the second read wordline and the corresponding track; and
   a means for disposing each write wordline landing pad of a plurality of write wordline landing pads on a corresponding track of the plurality of tracks, wherein:
     each write wordline landing pad is physically and directly coupled to the corresponding track; and
     each write wordline landing pad electrically couples the write wordline and the corresponding track.

15. The SRAM bit cell of claim 14, wherein:
   each first read wordline landing pad and corresponding track is disposed on a boundary edge of the SRAM bit cell;

each second read wordline landing pad and corresponding track is disposed on the boundary edge of the SRAM bit cell; and
each write wordline landing pad and corresponding track is disposed within each boundary edge of the SRAM bit cell.

16. A method of fabricating a static random access memory (SRAM) bit cell comprising:
disposing a plurality of tracks employed in a first metal layer;
disposing a write wordline employed in a second metal layer different from the first metal layer;
disposing a first read wordline employed in a third metal layer different from the first metal layer and the second metal layer;
disposing a second read wordline employed in a fourth metal layer different from the first metal layer, the second metal layer, and the third metal layer;
disposing each first read wordline landing pad of a plurality of first read wordline landing pads on a corresponding track of the plurality of tracks, wherein:
each first read wordline landing pad is physically and directly coupled to the corresponding track; and
each first read wordline landing pad electrically couples the first read wordline and the corresponding track;
disposing each second read wordline landing pad of a plurality of second read wordline landing pads on a corresponding track of the plurality of tracks, wherein:
each second read wordline landing pad is physically and directly coupled to the corresponding track; and
each second read wordline landing pad electrically couples the second read wordline and the corresponding track; and
disposing each write wordline landing pad of a plurality of write wordline landing pads on a corresponding track of the plurality of tracks, wherein:
each write wordline landing pad is physically and directly coupled to the corresponding track; and
each write wordline landing pad electrically couples the write wordline and the corresponding track.

17. The method of claim 16, wherein:
disposing each first read wordline landing pad comprises disposing each first read wordline landing pad and corresponding track on a boundary edge of the SRAM bit cell;
disposing each second read wordline landing pad comprises disposing each second read wordline landing pad and corresponding track on the boundary edge of the SRAM bit cell; and
disposing each write wordline landing pad comprises disposing each write wordline landing pad and corresponding track within each boundary edge of the SRAM bit cell.

18. The method of claim 16, wherein disposing the plurality of tracks comprises disposing twelve (12) tracks employed in a metal one (1) (M1) layer.

19. The method of claim 16, wherein disposing the write wordline comprises disposing the write wordline employed in a metal two (2) (M2) layer.

20. The method of claim 16, wherein disposing the first read wordline comprises disposing the first read wordline employed in a metal four (4) (M4) layer.

21. The method of claim 16, wherein disposing the second read wordline comprises disposing the second read wordline employed in a metal six (6) (M6) layer.

22. The method of claim 16, wherein:
disposing the write wordline comprises disposing the write wordline using self-aligned-double-patterning (SADP); and
disposing the plurality of tracks comprises disposing the plurality of tracks using self-aligned-double-patterning (SADP).

23. The method of claim 16, wherein disposing the write wordline comprises disposing the write wordline in a unidirectional orientation.

24. The method of claim 16, wherein disposing the first read wordline comprises disposing the first read wordline in a unidirectional orientation.

25. The method of claim 16, wherein disposing the second read wordline comprises disposing the second read wordline in a unidirectional orientation.

26. The method of claim 16, wherein disposing the plurality of tracks comprises disposing one (1) track of the plurality of tracks corresponding to a high voltage source line.

27. A static random access memory (SRAM), comprising:
an SRAM array, comprising a plurality of SRAM bit cells;
each SRAM bit cell of the plurality of SRAM bit cells comprises:
a plurality of tracks employed in a first metal layer;
a write wordline employed in a second metal layer different from the first metal layer;
a first read wordline employed in a third metal layer different from the first metal layer and the second metal layer;
a second read wordline employed in a fourth metal layer different from the first metal layer, the second metal layer, and the third metal layer;
each first read wordline landing pad of a plurality of first read wordline landing pads disposed on a corresponding track of the plurality of tracks, wherein:
each first read wordline landing pad is physically and directly coupled to the corresponding track; and
each first read wordline landing pad electrically couples the first read wordline and the corresponding track;
each second read wordline landing pad of a plurality of second read wordline landing pads disposed on a corresponding track of the plurality of tracks, wherein:
each second read wordline landing pad is physically and directly coupled to the corresponding track; and
each second read wordline landing pad electrically couples the second read wordline and the corresponding track; and
each write wordline landing pad of a plurality of write wordline landing pads disposed on a corresponding track of the plurality of tracks wherein:
each write wordline landing pad is physically and directly coupled to the corresponding track; and
each write wordline landing pad electrically couples the write wordline and the corresponding track.

28. The SRAM of claim 27, wherein:
each first read wordline landing pad and corresponding track is disposed on a boundary edge of the SRAM bit cell;
each second read wordline landing pad and corresponding track is disposed on the boundary edge of the SRAM bit cell; and each write wordline landing pad and corresponding track is disposed within each boundary edge of the SRAM bit cell.

* * * * *